United States Patent
Marchisi

(10) Patent No.: US 11,018,078 B2
(45) Date of Patent: May 25, 2021

(54) METHOD OF PRODUCING ELECTRONIC COMPONENTS, CORRESPONDING ELECTRONIC COMPONENT

(71) Applicant: STMICROELECTRONICS S.R.L., Agrate Brianza (IT)

(72) Inventor: Fabio Marchisi, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 177 days.

(21) Appl. No.: 16/031,998

(22) Filed: Jul. 10, 2018

(65) Prior Publication Data

US 2019/0043787 A1 Feb. 7, 2019

(30) Foreign Application Priority Data

Aug. 3, 2017 (IT) .................. 102017000089965

(51) Int. Cl.
*H01L 23/495* (2006.01)
*H01L 23/31* (2006.01)
*H01L 21/48* (2006.01)
*H01L 23/00* (2006.01)

(52) U.S. Cl.
CPC .... *H01L 23/49503* (2013.01); *H01L 21/4853* (2013.01); *H01L 21/4889* (2013.01); *H01L 23/3142* (2013.01); *H01L 23/4952* (2013.01); *H01L 23/49541* (2013.01); *H01L 23/3107* (2013.01); *H01L 24/45* (2013.01); *H01L 2224/45015* (2013.01); *H01L 2224/45144* (2013.01); *H01L 2224/45147* (2013.01); *H01L 2224/48247* (2013.01); *H01L 2224/49113* (2013.01); *H01L 2224/49171* (2013.01); *H01L 2224/85455* (2013.01)

(58) Field of Classification Search
CPC ... H01L 21/56; H01L 21/563; H01L 23/3114; H01L 23/495; H01L 23/3142; H01L 23/49582; H01L 23/49575; H01L 23/4952; H01L 29/49503; H01L 23/49861
See application file for complete search history.

(56) References Cited

U.S. PATENT DOCUMENTS

| | | | |
|---|---|---|---|
| 9,627,299 B1 | 4/2017 | Flessner | |
| 2005/0046008 A1* | 3/2005 | Gai | H01L 23/3107 257/690 |
| 2006/0006505 A1* | 1/2006 | Chiang | H01L 24/48 257/666 |
| 2013/0181335 A1* | 7/2013 | Ahn | H01L 23/495 257/676 |
| 2014/0353822 A1 | 12/2014 | Oyachi et al. | |
| 2016/0020182 A1 | 1/2016 | Higgins, III | |

FOREIGN PATENT DOCUMENTS

| | | |
|---|---|---|
| EP | 2816590 A2 | 12/2014 |
| JP | H0382066 A | 4/1991 |
| JP | 2009038145 A | 2/2009 |

* cited by examiner

*Primary Examiner* — Thanhha S Pham
(74) *Attorney, Agent, or Firm* — Seed IP Law Goup LLP

(57) ABSTRACT

A method of producing electronic components including at least one circuit having coupled therewith electrical connections including metallic wire bondable surfaces encased in a packaging, the method including bonding stud bumps, in particular copper stud bumps, at determined areas of said wire bondable surfaces.

17 Claims, 6 Drawing Sheets

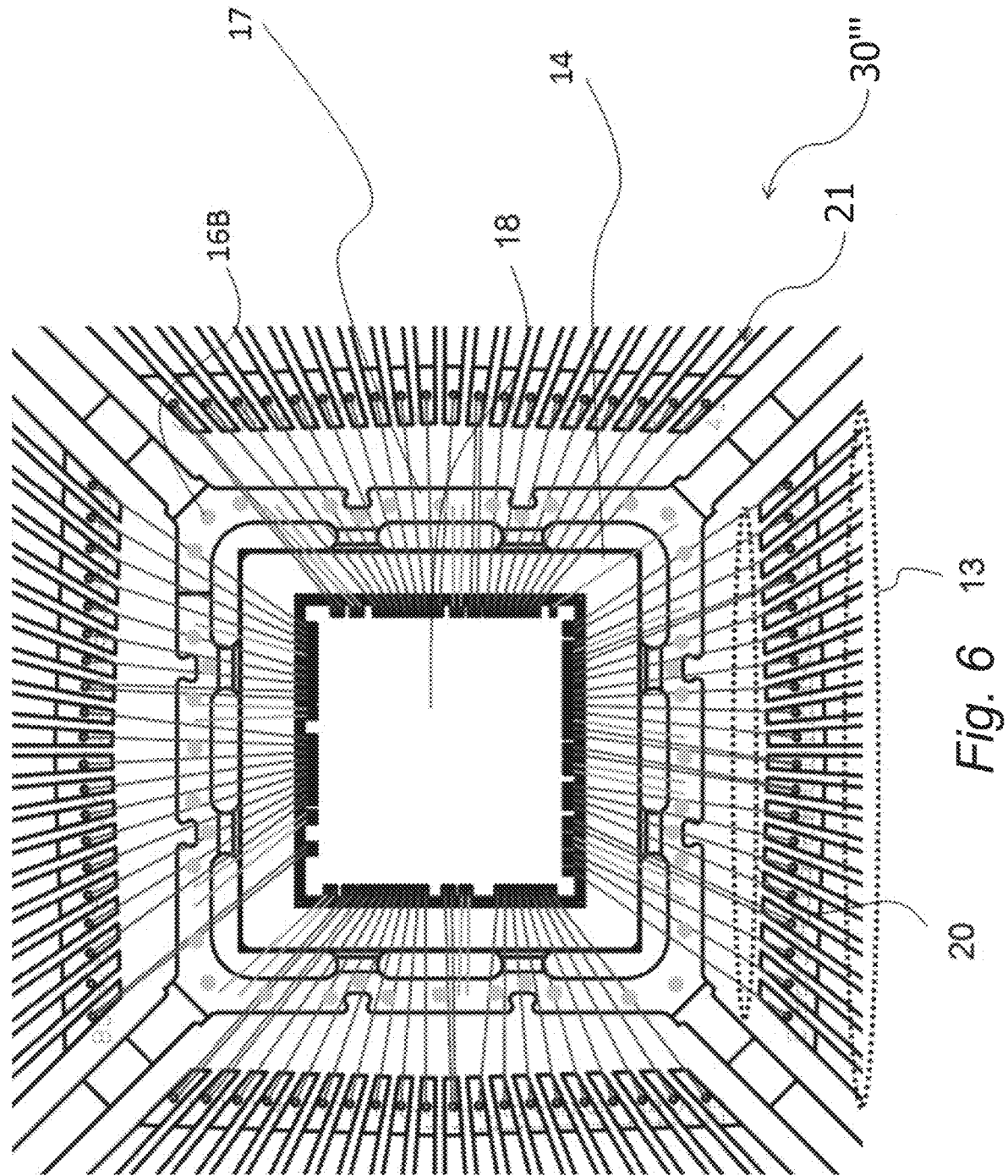

METHOD OF PRODUCING ELECTRONIC COMPONENTS, CORRESPONDING ELECTRONIC COMPONENT

BACKGROUND

Technical Field

The description relates to electronic components.

One or more embodiments may apply to producing so-called lead frames in electronic components such as, e.g., integrated circuits (ICs).

Description of the Related Art

Electronic components such as integrated circuits (ICs) may include one or more electronic circuits (e.g., a chip or "die"). These circuits (die) may be encased in a package and possibly arranged on a die pad. The package may include a plastics or ceramic packaging (e.g., a molding compound or MC), with die pads connected to pins of the package, with the die sealed within the package and electrically conductive wires (e.g., gold) connecting the pads to the pins. As a plastic packaging the molding compound is typically represented by an organic resin, e.g., epoxy resin, while the compound can contain other materials such as filler material.

Such wires were once attached by hand. In present-day technology that task is performed by machines, leading to a lead frame (LF), a set of metal leads that extend outside the package/housing to form electrical connection pins for the component.

Lead frames may be produced with a variety of processes.

For instance, lead frames may be etched, e.g., by photo-lithographic processes, by using light to transfer a geometric pattern from a photo-mask onto a light-sensitive, chemical "photoresist" layer deposited on a metallic strip. Once developed, the resist layer may be chemically removed from all those areas not affected by the exposure pattern and a photo mask remains on the metal surface to protect locally the strip from the etching action of, e.g., an acid flow.

Lead frames may also be stamped by creating a frame design on a strip by the progressive action of plural punches that remove material from the strip by mechanical action.

Packages used in automotive applications desire a continuous improvement in terms of adhesion of the package adhesion, i.e., resin or molding compound adhesion, with the lead frame, for this reason standard silver plated lead frames have been replaced with pre-plated rough finishing, in particular of copper.

Pre-plated rough finishing are however characterized by a cost that is minimizing final margin on the final product. Moreover, pre-plated rough finishing are presenting weakness on solderability assessment.

It is known to use solution which involve deposition of an Ag (silver) spot or of an Ag ring on the lead frame.

In this regard in FIG. 1 it is shown an electronic component 10 including lead frame 11 in the form of a bare copper frame on which an Ag spot 12 is plated as indicated by the diagonal lines. The Ag spot 12 is plated in the region of a pad 14 of the lead frame 11, on which a chip, not shown in FIG. 1, is glued, including also the region of a ground ring 17 of the lead frame 11 and the region of leads 13, specifically the terminal of portion the leads 13 towards the pad 14. As mentioned, alternatively the Ag plating can be performed only on the region of such ring 17 and of such leads 13, leaving without silver plating the pad 14.

As mention, in the final packaging the lead frame supporting the chip is included in a molding compound.

The Ag spot or Ag ring solution, as the silver plated surfaces in general for reason tied to the chemical affinity and the roughness properties, is characterized by a very poor adhesion with the molding compound. In particular measurements of the evolution of delaminated areas under thermo-mechanical stresses indicates that areas of maximum weakness are located around the die, delamination appearing on the die pad and proceeding until the ground ring, where are present wires for the wire bonding, going through ground ring supports.

This is shown in the drawing of FIGS. 2A-2D, which schematizes the result of thermo-mechanical Scanning Acoustic Microscope (SAM) measurements. FIG. 2A shows a lead frame 11 with a pad 14 and a die 18 on the pad. In FIG. 2A is shown a delamination region 19a in the die pad 14 near a corner. In FIG. 2B, which pertains to a subsequent time instant, the delamination region 19b includes the four corner of the pad 14. In FIG. 2C then a delamination region 19c includes the frame region between the pad 14 and the ring 17. In FIG. 17D the delamination region 19c includes ring delamination region 19d.

For this reason wide Ag plating surfaces are considered as weakness areas in term of delamination due to poor mechanical and chemical adherence with resin.

BRIEF SUMMARY

One or more embodiments may provide improvements in producing lead frames for electronic components capable of overcoming one or more drawbacks outlined in the foregoing.

One or more embodiments may refer to a corresponding component (e.g., a microelectronic component such as an integrated circuit).

The claims are an integral part of the disclosure of one or more exemplary embodiments as provided herein.

One or more embodiments is directed to a method of producing electronic components including at least one circuit having coupled therewith electrical connections including metallic wire bondable surfaces encased in a packaging, the method including bonding stud bumps, in particular copper stud bumps, at determined areas of said wire bondable surfaces.

One or more embodiments may involve that said determined areas are areas identified as preferential in the delamination propagation.

One or more embodiments may involve identifying determined areas (preferential in the delamination propagation by thermo-mechanical simulations estimating said delamination of the of the wire bondable surfaces, in particular a lead frame or by performing a measurement of said delamination, in particular by SAM analysis.

One or more embodiments may involve that said wire bondable surfaces include metallic wire bondable surfaces of a BGA (Ball Grid Array) based integrated circuit, in particular bond fingers and/or metal rings One or more embodiments may involve that the wire bondable surfaces include a lead frame of electrically conductive material, the method including the bonding stud bumps at determined areas of the circuit One or more embodiments may involve that the lead frame is a lead frame including a metal plating, in particular silver plating, over an area including a pad and a ground ring of the lead frame or including the ground ring only.

One or more embodiments may involve including placing one more stud bumps in one or more determined area corresponding to a down set of bars of the lead frame.

One or more embodiments may involve bonding said stud bumps on said ground ring of the lead frame only, or on said pad of the lead frame only, or both on said ground ring and said pad of the lead frame.

One or more embodiments may involve further including encasing in a package comprising a molding compound said circuit.

One or more embodiments may involve including attaching a die of said circuit to said pad and performing a wire bonding operation, encasing in a package comprising a molding compound the circuit attached to the lead frame.

Embodiments described herein include an electronic component, preferably an integrated circuit, including at least one circuit or die (18) produced with the method of any of the embodiments described above.

One or more embodiments may offer the following advantages, i.e., that of improving resin adhesion between the package molding compound and the lead frame thanks to mechanical anchoring realized by the stud bumps localized in critical areas of the lead frame.

BRIEF DESCRIPTION OF THE SEVERAL VIEWS OF THE DRAWINGS

One or more embodiments will now be described, purely by way of non-limiting example, with reference to the annexed figures, wherein:

FIGS. 4, 5, and 6 are schematic representation of different embodiments;

It will be appreciated that, in order to facilitate understanding the embodiments, the various figures may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. That is, one or more characteristics exemplifies in connection with a certain figure can be applied to any embodiment as exemplified in any other figure.

The references used herein are provided merely for convenience and hence do not define the scope of protection or the scope of the embodiments.

In general, the solution here described provides, starting from a circuit, such as a chip or die, including metallic wire bondable surfaces to be encased in a packaging, in particular a lead frame, in particular with a pre-plated finishing including a standard Ag spot or Ag ring, increasing resistance to delamination during thermal cycles by placing stud bumps, preferably copper bumps on determined areas of the metallic wire bondable surface, in particular on the lead frame, which are located in critical areas of the frame surface, for example around areas identified as preferential in the delamination propagation.

A metallic wire bondable surface is a metal surface on which wire bonding, preferably with copper or gold, can be performed. Preferably such metallic wire bondable surface is a silver surface, which usually has also one of the lower adhesion to the mold compound. In variant embodiments said wire bondable surface can be a nickel palladium or nickel phosphorous surface or a surface of an alloy combining nickel, palladium and gold.

Figure 1:
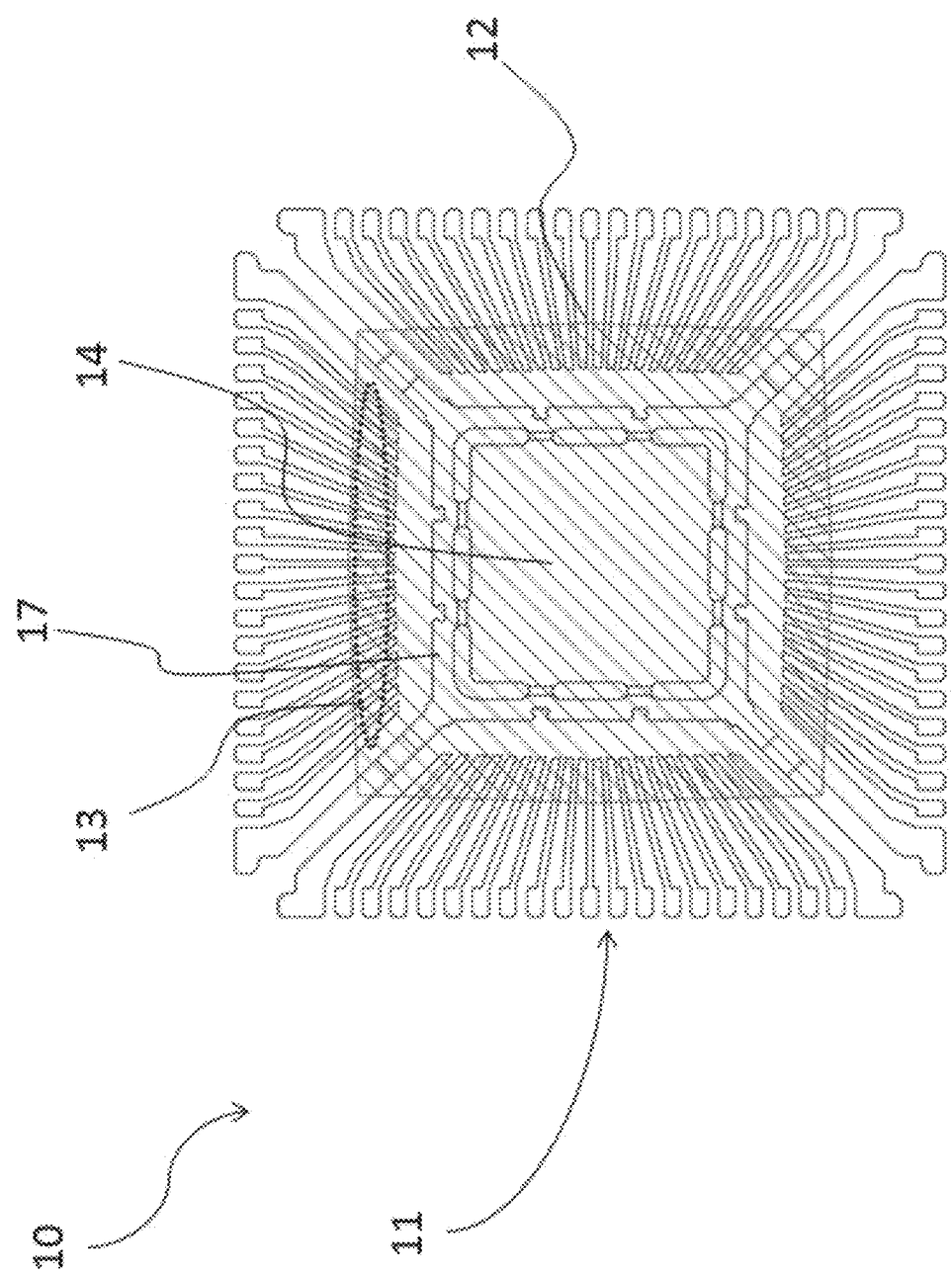
FIGS. 1 and 2(A)-2(D) have been already discussed in the foregoing is a schematic representation of one or more embodiments.
Figure 2:
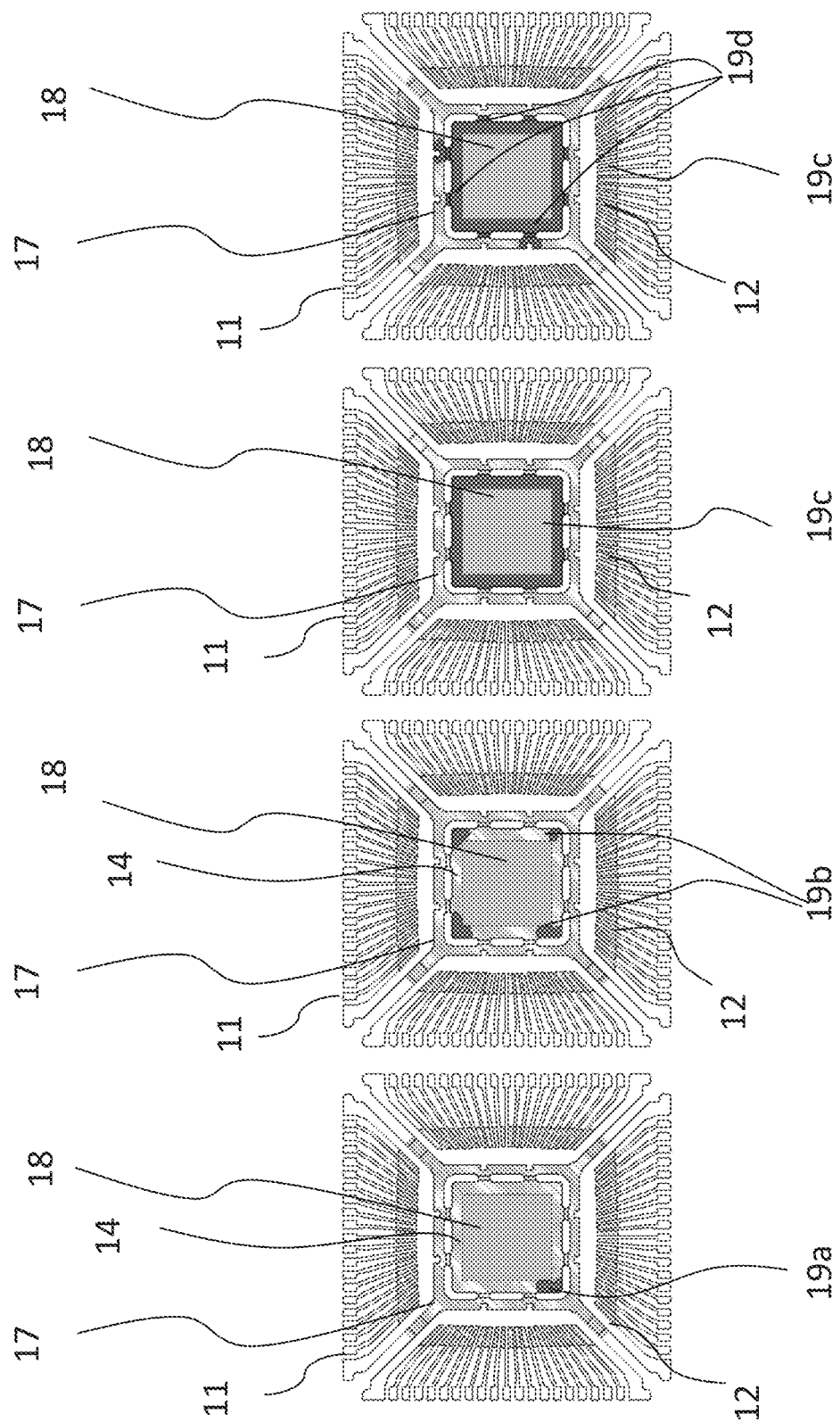
Figure 3:
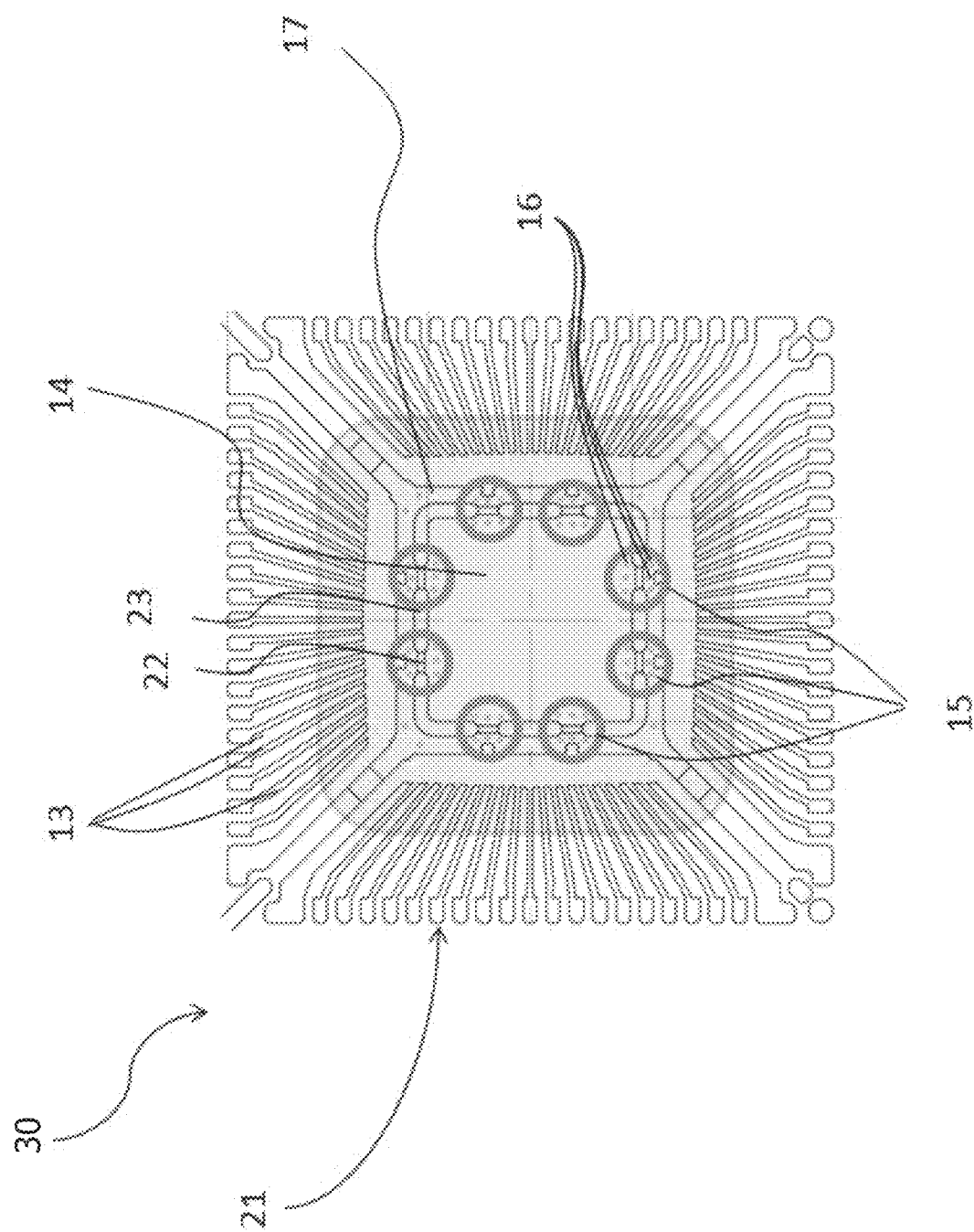
FIG. 3 is a schematic plan view of one or more embodiments.

In this regard in FIG. 3 it is shown an electronic component 30 including a lead frame 21 on which a plurality of critical areas 15 is indicated. As mentioned, critical areas 15 can be identified. Such critical areas 15 are more probable to correspond or to be placed near the surfaces of the component 30 with the lowest adhesion with respect to the mold compound, i.e., the silver surfaces in the embodiment described, however of course the probability of having delamination propagation depends also from the thermo-mechanical properties of the system represented by the electronic component 30. A determination of the critical areas 15 can be therefore achieved through measurements of the evolution of delaminated areas under thermo-mechanical stresses, for instance performing a SAM analysis of the lead frame 21 and, for instance, selecting the areas subjected to the greater stress. These types of analysis are known per se to the person skilled in the art.

In FIG. 3 the critical areas 15 located on a die pad around a semiconductor die (18 in FIGS. 4-6) and in correspondence of down sets 22 of ground bars 17. Such down sets 22, as also shown in the measurements of FIG. 3, are regions prone to promote delamination progress versus areas where the wire bonding is present.

As shown in FIG. 3 in each critical area 15 are inserted electrically and/or thermally conductive, preferably copper, balls or beads, to produce a plurality of stud bumps 16, preferably copper stud bumps. In variant embodiments, the stud bumps can be made of gold or silver, the copper being however a choice of material giving a higher adhesion at a lower cost.

Stud bumps 16 are for instance bonded on areas characterized by low adhesion with molding compound for example silver plated areas of the lead frame 11 in particular in the critical areas 15 by a bonding technique which in variant embodiments may correspond to that of the wire bonding, specifically ball bonding. In particular, placing the studs bump 16 may include a step of lowering a capillary copper wire to the surface of the lead frame 21, which is preferably heated, then the capillary copper wire is pushed down and the bonding machine applies ultrasonic energy with an attached transducer. The combined heat, pressure, and ultrasonic energy create a weld between the copper ball and the surface of the frame 11. In this case, the wire is then detached by the ball, for instance simply moving transversally the wire so that the wire breaks above the ball, leaving the stud bump 16.

Thus, as shown above, an embodiment of the method here described may include to place one more stud bumps 16 in one or more determined area 15 corresponding to a down set of bars, i.e., power bars or support bars, of the lead frame 21.

The plurality of stud bumps 16 placed in critical areas 15 of the standard lead frame 11 determines a mechanical anchoring which improves the resin, i.e., molding compound adhesion.

Figure 4:
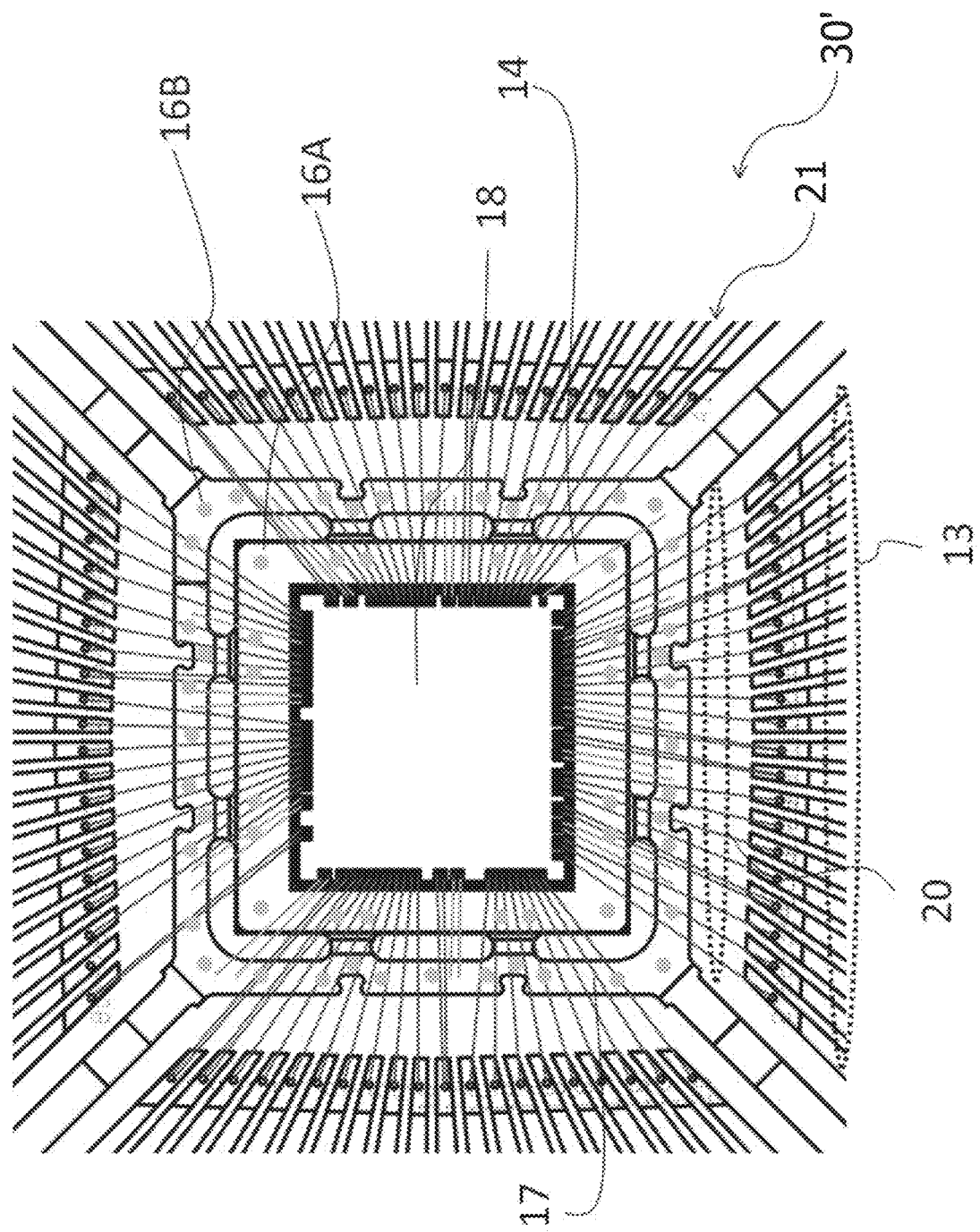

In FIG. 4 it is shown an electronic component or package 30' manufactured by steps of the method described above. The electronic component 30' includes the leadframe 21 on which is placed a semiconductor die 18. The semiconductor die 18 includes an active surface in which one or more integrated circuits are formed as is well known in the art. In FIG. 4 are also shown wires 20 connecting terminals of the die 18 to the leads 13 of the lead frame 21. The lead frame 21 is bonded with a configuration of bumps 16A which is bonded on the ring 17 and a configuration of bumps 16B which is bonded on the pad 14.

Figure 5:
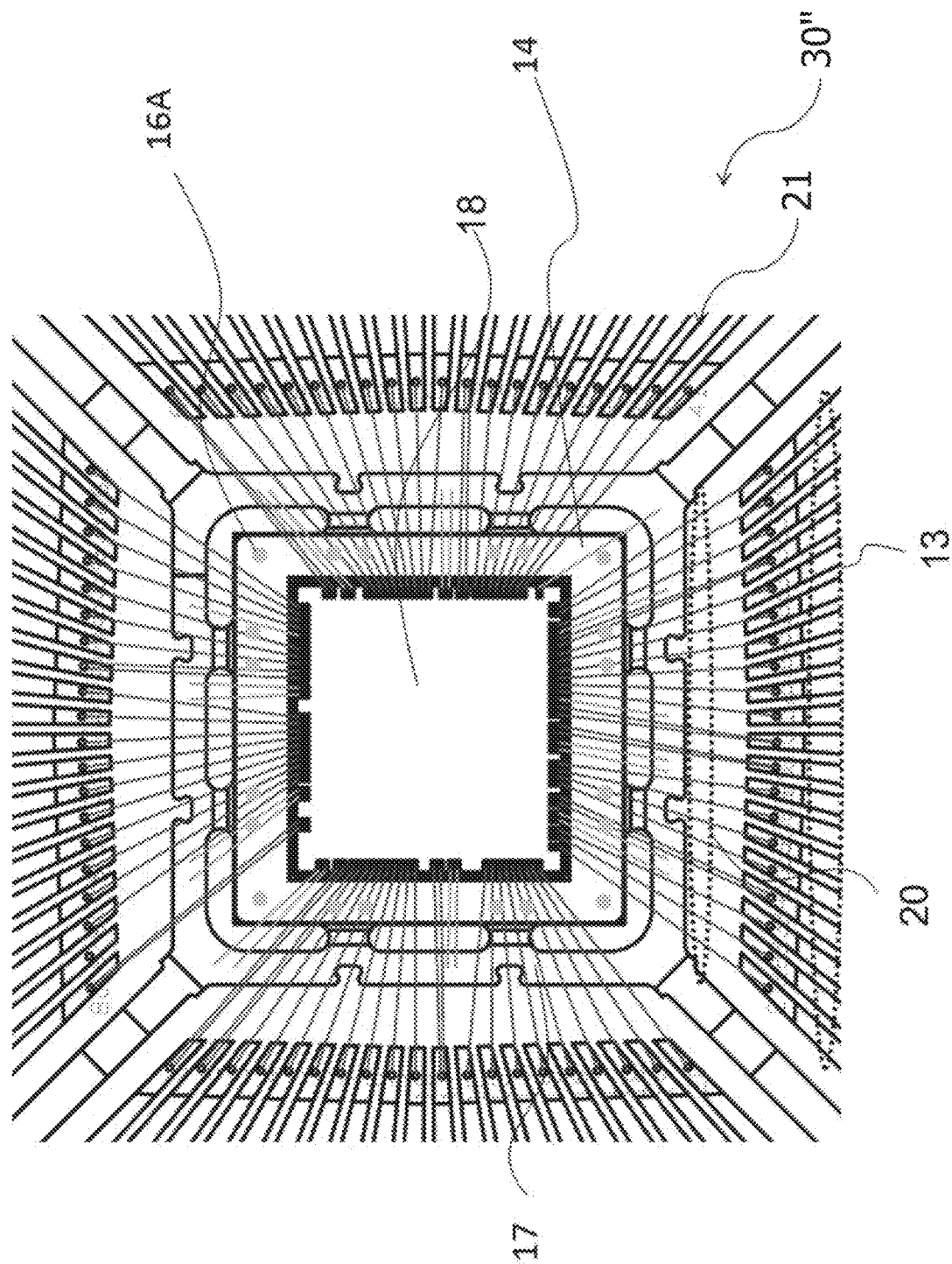

FIG. 5 and FIG. 6 show the configuration of the stud bumps 16A on the ring 17 (component 30" in FIG. 5) and 16B on the pad 14 (component 30''' in FIG. 6) separately.

The die 18 and the lead frame 21 of FIGS. 4, 5 and 6, in a step of packaging here not shown, are subsequently encased in a package by a molding compound (MC), which anchors to the bumps 16A or 16B or both 16A and 16B. The package or electronic component includes a die connected to pins or leads 21, with the die sealed within the package and electrically conductive wires (e.g., gold) connecting the pads of the die to the leads.

In some embodiments, the conductive bumps are only on a ground ring 17 of the lead frame, only on the die pad 14 of the lead frame, or only on both the ground ring 17 and the die pad 14 of the lead frame.

As mentioned, the copper stud bonding can be obtained by employ the ball bonding deposition steps of a standard wire bonding process. By way of example a 2.0 millimeters (2.0 mils) Cu wire may be used.

Without prejudice to the underlying principles, the details and embodiments may vary, even significantly, with respect to what is illustrated herein purely by way of non-limiting example, without thereby departing from the extent of protection.

Although the solution has been described with reference metallic wire bondable surfaces represented by metallic plated lead frames, the solution here described can be applied to producing electronic components including one or more circuits including metallic wire bondable surfaces which are then encased in a packaging, this meaning that in variant embodiments such metallic wire bondable surfaces can be any metal surface of an integrated circuit on which a wire bonding can be performed. For instance the metallic wire bondable surfaces can be also represented by a plated surface of the die, so that to enhance the adhesion of the mold compound to the die. Also, the electronic component may not include a lead frame, the metallic wire bondable surfaces corresponding to the ones, such as bond fingers and metal rings, of a BGA (Ball Grid Array) based integrated circuit and the stud bumps can be bonded in areas of such bond fingers and/or metal rings.

The electronic component or package may be formed in any order. For instance, the semiconductor die may be bonded to the die pad after or before the conductive bumps are coupled to the lead frame, such as the perimeter of the die pad and/or the ground ring.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
coupling a semiconductor die to a die pad of a lead frame, the semiconductor die including an active surface;
forming conductive bumps only on the die pad of the lead frame, the conductive bumps being only on the die pad of the lead frame;
electrically coupling the active surface of the semiconductor die to one or more leads of the lead frame; and
forming a package body over the semiconductor die, the die pad, and the conductive bumps by adhering the package body to the lead frame and the conductive bumps.

2. The method of claim 1, wherein forming the conductive bumps comprises forming the conductive bumps on a perimeter of the die pad.

3. The method of claim 2, wherein the conductive bumps are arranged laterally to the semiconductor die.

4. The method of claim 1, wherein the lead frame is a copper lead frame, wherein the die pad includes a layer of silver, the conductive bumps being formed on the layer.

5. The method of claim 4, wherein the lead frame is a copper lead frame including a metal layer.

6. The method of claim 1, wherein forming conductive bumps on only the die pad of the lead frame further comprises forming the conductive bumps on a portion of the die pad of the lead frame that is recessed from a surface of the leads.

7. The method of claim 1, wherein electrically coupling the active surface of the semiconductor die to one or more leads of the lead frame comprising coupling first ends of wires to the active surface of the semiconductor die and second ends of the wires to the one or more leads.

8. The method of claim 1, wherein forming the conductive bumps on the die pad of the lead frame further comprises forming the conductive bumps around a perimeter of the semiconductor die.

9. The method of claim 1, wherein forming the conductive bumps on the die pad further comprises selecting areas on the die pad subject to greater stress and forming the conductive bumps at the areas on the die pad subject to greater stress.

10. A method comprising:
coupling a semiconductor die to a die pad of a lead frame, the semiconductor die including an active surface;
forming conductive bumps only on a ground ring of the lead frame, the conductive bumps being only on the ground ring of the lead frame;
electrically coupling the active surface of the semiconductor die to one or more leads of the lead frame; and
forming a molding compound on the semiconductor die, the ground ring, and the conductive bumps by adhering the molding compound to the lead frame.

11. The method of claim 10, wherein forming conductive bumps further comprises forming conductive bumps on the die pad of the lead frame.

12. The method of claim 10, further comprising electrically coupling the active surface of the semiconductor die to the ground ring of the lead frame by forming electrical wires that have first ends coupled to the ground ring of the lead frame between the conductive bumps on the ground ring and second ends coupled to the active surface.

13. The method of claim 10, wherein electrically coupling the active surface of the semiconductor die to the one or more leads of the lead frame further comprises forming electrical wires overlapping the conductive bumps.

14. A method comprising:
coupling a die to a die pad of a lead frame, the semiconductor die including an active surface;
forming conductive bumps only on a ground ring of the lead frame and only on the die pad of the lead frame, the conductive bumps being only on the ground ring of the lead frame and only on the die pad of the lead frame;
electrically coupling the active surface of the semiconductor die to one or more leads of the lead frame; and
forming a molding compound on the semiconductor die, the die pad, and the conductive bumps by adhering the molding compound to the lead frame.

15. The method of claim 14, wherein forming the conductive bumps on the ground ring of the lead frame and the die pad of the lead frame further comprises forming the conductive bumps to surround the die.

16. The method of claim 14, wherein electrically coupling the active surface of the semiconductor die to the one or more leads of the lead frame further comprises forming electrical wires overlapping the conductive bumps.

17. The method of claim 14, further comprising electrically coupling the active surface of the semiconductor die to the ground ring of the lead frame by forming electrical wires that have first ends coupled to the ground ring between the conductive bumps on the ground ring and second ends coupled to the active surface of the die.

* * * * *